(12) United States Patent
Singh et al.

(10) Patent No.: US 7,888,248 B2
(45) Date of Patent: Feb. 15, 2011

(54) METHOD OF PRODUCING LARGE AREA SIC SUBSTRATES

(75) Inventors: Narsingh Bahadur Singh, Ellicott City, MD (US); Brian P. Wagner, Baltimore, MD (US); David J. Knuteson, Columbia, MD (US); David Kahler, Arbutus, MD (US); Andre E. Berghmans, Owing Mills, MD (US); Michael Aumer, Raleigh, NC (US); Jerry W. Hedrick, Arnold, MD (US); Marc E. Sherwin, Catonsville, MD (US); Michael M. Fitelson, Columbia, MD (US); Mark S. Usefara, Baltimore, MD (US); Sean McLaughlin, Severn, MD (US); Travis Randall, Baltimore, MD (US); Thomas J. Knight, Silver Spring, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 690 days.

(21) Appl. No.: 11/826,278

(22) Filed: Jul. 13, 2007

(65) Prior Publication Data
US 2009/0014756 A1    Jan. 15, 2009

(51) Int. Cl.
*H01L 21/20* (2006.01)
(52) U.S. Cl. .................................... 438/492
(58) Field of Classification Search .................. 438/492
See application file for complete search history.

(56) References Cited

U.S. PATENT DOCUMENTS

| 6,117,233 | A | 9/2000 | Bill et al. |
|---|---|---|---|
| 6,328,796 | B1 | 12/2001 | Kub et al. |
| 2004/0129200 | A1* | 7/2004 | Kouvetakis et al. ............ 117/2 |
| 2004/0261689 | A1 | 12/2004 | Tsong |
| 2006/0169987 | A1* | 8/2006 | Miura et al. .................. 257/79 |
| 2006/0261479 | A1* | 11/2006 | Marsh ......................... 257/751 |
| 2009/0014756 | A1* | 1/2009 | Singh et al. ................. 257/200 |

FOREIGN PATENT DOCUMENTS

JP    63-103893    5/1988

OTHER PUBLICATIONS

Luo et al., "Localized epitaxial growth of hexagonal & cubic SiC films by vacuum annealing" Applied Physics Ltrs, V. 69, issue 7, pp. 916-918, Aug. 12, 1996—Abstract.
International Search Report issued Oct. 20, 2008 in counterpart foreign application in the WIPO under application No. PCT/US08/08579.

* cited by examiner

*Primary Examiner*—Bradley K Smith
(74) *Attorney, Agent, or Firm*—Andrews Kurth LLP

(57) ABSTRACT

A method for growing a SiC-containing film on a Si substrate is disclosed. The SiC-containing film can be formed on a Si substrate by, for example, plasma sputtering, chemical vapor deposition, or atomic layer deposition. The thus-grown SiC-containing film provides an alternative to expensive SiC wafers for growing semiconductor crystals.

14 Claims, 12 Drawing Sheets

METHOD OF PRODUCING LARGE AREA SIC SUBSTRATES

TECHNICAL FIELD

The invention relates generally to semiconductor materials, and more particularly to methods for producing large area, wide bandgap SiC containing film on a Si wafer.

BACKGROUND OF THE INVENTION

The development of modern electronic devices places an ever increasing demand on the quality of the semiconductor materials used in these devices. Commonly used substrates for growing semiconductor materials, such as sapphire and Si, typically cause large defects in the semiconductor materials grown on these substrates, which in turn adversely affect the performance and reliability of the electronic device employing the semiconductor materials.

The poor quality of the epitaxially grown semiconductor crystals is generally due to the unavailability of a lattice matched and chemically matched substrate. When a film is grown on a substrate such that the crystal structure of the substrate is reflected on the film, the thus-grown film exhibits microstructural discontinuity at the interface between layers formed of different semiconductor materials (i.e., the interface between the substrate and the film grown on the substrate). Since the thickness of the film is considerably smaller than that of the substrate, the difference in lattice constant between the film and the substrate causes generation of strain and defects in the film.

For example, when a crystal of a nitride semiconductor, such as gallium nitride (GaN), is grown on a starting substrate made of silicon (Si) or the like and then cooled to the ordinary temperature, a large number of dislocations and cracks occur in the nitride semiconductor layer because of stress caused by the difference in thermal expansion coefficient or lattice constant. If a large number of dislocations and cracks occur in the growth layer (nitride semiconductor layer), lattice defects or a large number of dislocations, deformations, cracks, etc., occur in a film when the film is epitaxially formed on the growth layer. This causes deterioration of the film characteristic.

Certain oxide substrates, such as ZnO, show some promise, but they often react with by-products during the epitaxial growth. The best commercially available substrate for growing semiconducting films is SiC. However, SiC wafers, especially large SiC wafers, are very expensive.

Therefore, demand has arisen for the development of a high quality substrate for growing compound semiconductor films with reduced crystal defects.

SUMMARY OF THE INVENTION

A method for producing a SiC-containing film deposited on a Si substrate (a "SiC-on-Si film") is disclosed. The method comprises the steps of etching a Si substrate to remove any native oxide, and epitaxially growing a first film on the Si substrate at temperatures below 1000° C., wherein the first film comprises SiC.

Also disclosed are SiC-containing films produced by depositing SiC or SiC-containing materials on a Si substrate at temperatures below 1000° C.

Further disclosed are electronic devices employing SiC-containing films produced by depositing SiC or SiC-containing materials on a Si substrate at temperatures below 1000° C.

DETAILED DESCRIPTION OF DRAWINGS

DETAILED DESCRIPTION OF THE INVENTION

Figure 1:
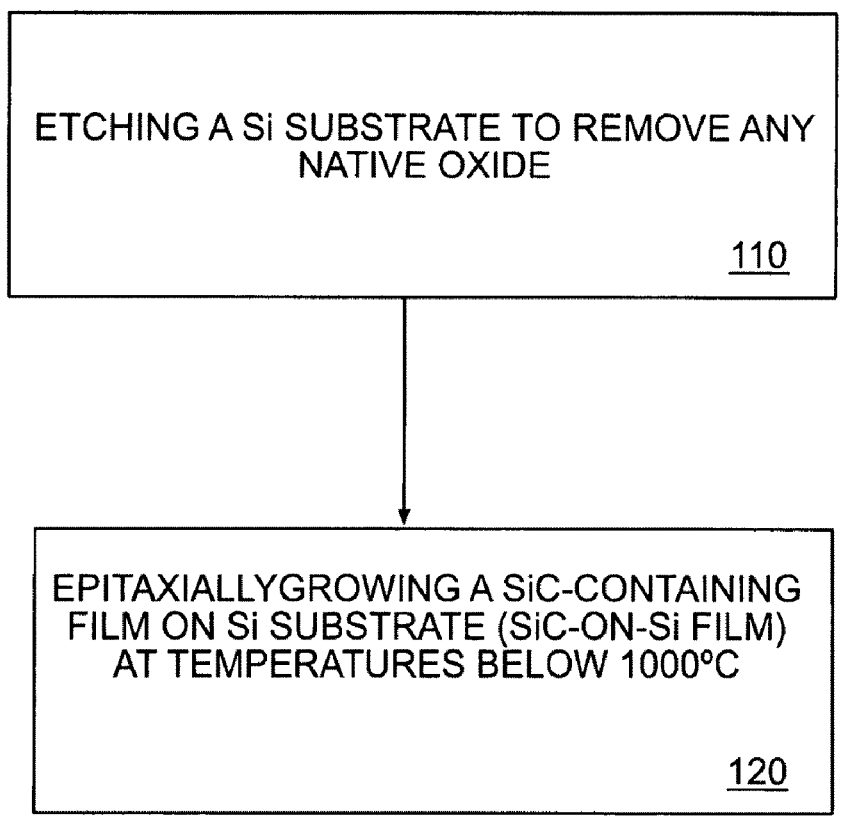
FIG. 1 is a flow chart showing an embodiment of a method for depositing a SiC film on a Si substrate.

FIG. 1 schematically shows a process 100 for growing a SiC-containing film on a Si substrate. The process include the steps of etching a Si substrate to remove any native oxide (step 110), and epitaxially growing a SiC-containing film on the Si substrate (SiC-on-Si film) at temperatures below 1000° C. (step 120).

As used herein, the term "SiC-containing film" refers to any semiconductor films having a SiC component. For example, the SiC-containing film can be a pure SiC film, a multi-layer film containing a SiC layer, or a film having a SiC heterostructure such as $SiC_xGe_{(1-x)}$ or $SiC_xAlN_{(1-x)}$, where $0<x<1$.

The Si substrate can be Si wafers of any size and orientation. Preferably, the Si substrate has a (111) orientation. Depending on the intended use of the SiC-containing film, the Si substrate can be a doped Si substrate or semi-insulating Si substrate. For example, if the SiC-containing films will be used as substrates of GaN high electron mobility transistors (HEMT), semi-insulating Si substrate is preferred over n-type or p-type Si substrate in order to avoid a parasitic capacitance produced from having a conductive substrate beneath devices in high-frequency operation.

The etching step can be performed with hydrofluoric acid (HF). In one embodiment, the Si wafer is etched in 10% HF to remove any native oxide. In another embodiment, the Si wafer is dried with nitrogen gas after the etching step.

SiC-containing films can be grown on Si substrate using plasma sputtering, chemical vapor deposition (CVD) or reactive atomic layer deposition (RALD) techniques. If the deposited material comprises pure SiC, the thus-grown film is termed a "SiC-on-Si film."

Sputtering is a physical process whereby atoms in a solid target material are ejected into the gas phase due to bombardment of the material by energetic ions. It is a commonly used technique for thin-film deposition. In plasma sputtering devices, the ions for the sputtering process are supplied by a plasma that is induced in the sputtering equipment. A variety of techniques can be used to modify the plasma properties, especially ion density, to achieve the optimum sputtering conditions, including usage of RF (radio frequency) direct current (DC), alternating current, utilization of magnetic fields, and application of a bias voltage to the target.

Sputtering sources are usually magnetrons that utilize strong electric and magnetic fields to trap electrons close to the surface of the magnetron, which is known as the target. The electrons follow helical paths around the magnetic field lines undergoing more ionizing collisions with gaseous neutrals near the target surface than would otherwise occur. The sputter gas is inert, typically argon. The extra argon ions created as a result of these collisions leads to a higher deposition rate. It also means that the plasma can be sustained at a lower pressure. Sputtered atoms ejected into the gas phase are not in their thermodynamic equilibrium state, and tend to deposit on all surfaces in the vacuum chamber. A substrate (such as a Si wafer) placed in the chamber will be coated with a thin film.

In one embodiment, a SiC film is deposited on the Si substrate with radio frequency (RF) plasma sputtering using a SiC wafer as a target material for the sputter gun. The SiC on Si deposition can also be achieved using different target materials. For example, a Si target can be used in a methane or propane atmosphere for a reactive sputtering of SiC. Separate Si and C targets can also be employed to deposit SiC on Si. The target materials may further comprises n-type or p-type dopants for the production of doped SiC-on-Si films.

In another embodiment, direct current (DC) plasma sputtering is used to grow a SiC film on the Si substrate. A DC plasma is created by an electrical discharge between two electrodes. A plasma support gas, typically argon, is necessary for the generation of a DC plasma. Targets can be deposited on one of the electrodes. Insulating solid targets are placed near the discharge so that ionized argon gas atoms sputter the target into the gas phase. DC plasma allows an operator to gain greater control of the deposition process, especially when reactively sputtering SiC.

In another embodiment, the SiC film is grown on Si substrate with reactive sputtering using Si as a target and a reactive atmosphere of methane.

In another embodiment, the SiC-containing film is grown on the Si substrate using a chemical vapor deposition technique. Chemical vapor deposition techniques provide the advantage of growing a film at a temperature below its melting point. In the CVD process, a chemical reaction is utilized to deposit a solid material from a gaseous phase. CVD includes processes such as low temperature reactive chemical vapor deposition (LTRCVD), Atmospheric Pressure Chemical Vapor Deposition (APCVD), Low Pressure Chemical Vapor Deposition (LPCVD), Metal-Organic Chemical Vapor Deposition (MOCVD), Plasma Assisted Chemical Vapor Deposition (PACVD) or Plasma Enhanced Chemical Vapor Deposition (PECVD), Laser Chemical Vapor Deposition (LCVD), Photochemical Vapor Deposition (PCVD), Hot Wire CVD (HWCVD), Chemical Vapor Infiltration (CVI) and Chemical Beam Epitaxy (CBE), and Hydride Vapor Phase Epitaxy (HVPE).

In one embodiment, the Si substrate is carbonized before the deposition of the SiC-containing film. Carbonization of the Si substrate sometimes results in better morphologies in the SiC-containing film. In one embodiment, carbonization of Si substrate is performed by cracking of propane at a temperature above 1250° C.

In another embodiment, the SiC film is grown on Si substrate with LTRCVD using a SiC precursor. Table 1 provides a list of commonly used SiC precursors. A preferred SiC precursor for LTRCVD is hexamethyldisilane.

TABLE 1

| Commonly used SiC precusors |
| --- |
| N,N',N",-Tri-tert-butylsilanetriamine |
| N,N,N',N'-Tetra-methylsilanediamine |
| 2,4,6,8-Tetramethylcyclotertrasiloxane |
| 2,4,6,8,10-Pentamethylcyclopentasiloxane |
| Tetraethylsilane |
| Hexamethyldisilane |
| 1,2-Di(methylisilyl)ethane |
| Tris Dimethylamino silane (3-DMAS) |
| Tetrakis(dimethylamino) silane |
| 2-Dodecamethylcyclotetrasilane |
| Octaphenylcyclotetrasilane |
| Diethylsilane |
| Tetramethylsilane |
| Di-Tert-Butylsilane |
| Tetramethylsilane |
| Di-Tert-Butylsilane |
| Methyltrichlorosilane |
| Tetrakis(ethylmethylamido) silane |
| Tetramethylsilane |
| Di-Tert-Butylsilane |
| Methyltrichlorosilane |
| Tetrakis(ethylmethylamido) silane |
| Tetrakis(trimethylsilyl) silane |

The CVD techniques may also be used to grow SiC heterostructures, such as $SiC_{(x)} Ge_{(1-x)}$ and $SiC_{(x)} AlN_{(1-x)}$ on the Si substrate. In one embodiment, SiC heterostructure films are developed by CVD at temperatures below 1000° C. using hexamethyldisilane (HMDS) as SiC source, ammonia as nitrogen source, trimethylaluminum (TMA) as aluminum source, and teramethylgermanium (TMGe) as germanium source.

The SiC-to-Ge or SiC-to-AlN ratio in $SiC_{(x)} Ge_{(1-x)}$ or $SiC_{(x)} AlN_{(1-x)}$ film, respectively, is determined by the background pressure of the vapor deposition process, as well as the HMDS-to-TMGe or HMDS-to-ammonia-to-TMA ratio. $SiC_{(x)} Ge_{(1-x)}$ or $SiC(X) AlN_{(1-x)}$ films having different SiC-to-Ge or SiC-to-AlN ratios can be obtained by adjusting the HMDS-to-TMG or HMDS-to-ammonia-to-TMA ratios in the starting materials and by varying the background pressure.

The SiC-to-Ge or SiC-to-AlN ratio determines the lattice parameters, such as the lattice constant and bandgap of the $SiC_{(x)} Ge_{(1-x)}$ or $SiC_{(x)} AlN_{(1-x)}$ film. For example, AlN-rich $SiC_{(x)} AlN_{(1-x)}$ films have lattice constants and bandgaps that are closer to that of AlN. While SiC-rich $SiC_{(x)} AlN_{(1-x)}$ films have lattice constants and bandgaps that are closer to that of SiC. Accordingly, the SiC-to-AlN ratio in the starting materials and the background pressure of the vapor deposition are selected based on the intended application of the $SiC_{(x)} AlN_{(1-x)}$ film.

For example, if the $SiC_{(x)} AlN_{(1-x)}$ film is used as the substrate to grow GaN crystals, a low SiC-to-AlN ratio is preferred because AlN provides a better lattice match to GaN. The lattice constants for SiC, GaN and AlN are 3.073 Å, 3.189 Å and 3.112 Å. By increasing the concentration of AlN, the lattice parameter moves closer to the lattice parameter of GaN and hence better epitaxial growth is possible.

It should be noted that deposition of AlN may result in p-type doping of the Si substrate. A thick pure SiC layer or a doped SiC layer may be used to prevent unintentional p-type doping of the Si substrate during the deposition of AlN.

In another embodiment, the SiC-containing film is deposited on the Si substrate by reactive atomic layer deposition (RALD). Atomic layer deposition is a self-limiting, sequential surface chemistry that deposits conformal thin-films of materials onto substrates of varying compositions. Atomic layer deposition is similar in chemistry to CVD, except that the atomic layer deposition reaction breaks the CVD reaction into two half-reactions, keeping the precursor materials separate during the reaction. Atomic layer deposition film growth is self-limited and based on surface reactions, which makes it possible to achieve atomic scale deposition control. By keeping the precursors separate throughout the coating process, RALD-grown film can be obtained as fine as 0.1 angstroms per monolayer.

Atomic layer deposition also has unique advantages over other thin film deposition techniques, as ALD grown films are conformal, pin-hole free, and chemically bonded to the substrate. Since ALD typically provides a very slow growth rate of the SiC film, low temperature precursors of SiC may be added in the atmosphere to enhance the growth rate of the SiC-containing film Another aspect of the present invention relates to the SiC-on-Si films produced using the method of the present invention.

Yet another aspect of the present invention relates to electronic devices, such as diodes, that employ the SiC-on-Si films of the present invention.

EXAMPLES

Example 1

Figure 2:
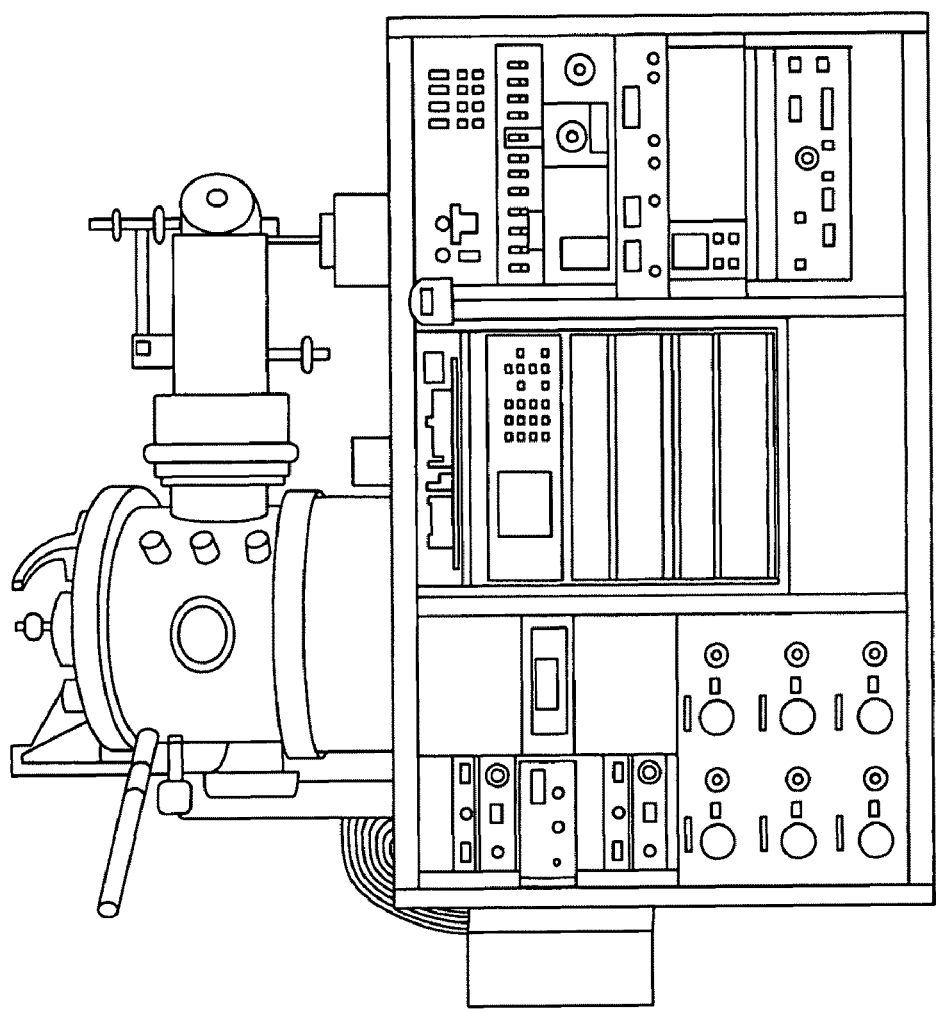
FIG. 2 is a picture of a sputtering system used for the deposition of SiC film on the Si substrate (Sic-on-Si film). The sputtering system is capable of generating RF and DC plasmas.

Deposition of SiC Films on Si Substrate Using RF Plasma with Resistive Heating of the Si Substrate Two-inch, single-side polished Si (111) wafers were used as substrates. The Si wafers were etched in 10% HF to remove any native oxide. The etched wafer was dried with nitrogen gas and immediately loaded into the growth chamber of a sputtering system shown in FIG. 2.

Briefly, the Si substrate was clamped into a 2" resistive heater and the chamber was evacuated to a base pressure of about $5 \times 10^{-8}$ Torr. Once the base pressure was reached, the substrate/heater assembly was ramped to a 850° C. growth temperature at a ramp rate of 3° C./minute. Argon gas was used as the RF plasma gas. The argon gas flow was set to 50 sccm. During deposition, the chamber was actively pumped and maintained a chamber pressure of about 8 mTorr. The RF forward power was 100 watts, with a DC bias of approximately −250V. The sputter gun used a 3" SiC target.

Figure 3:
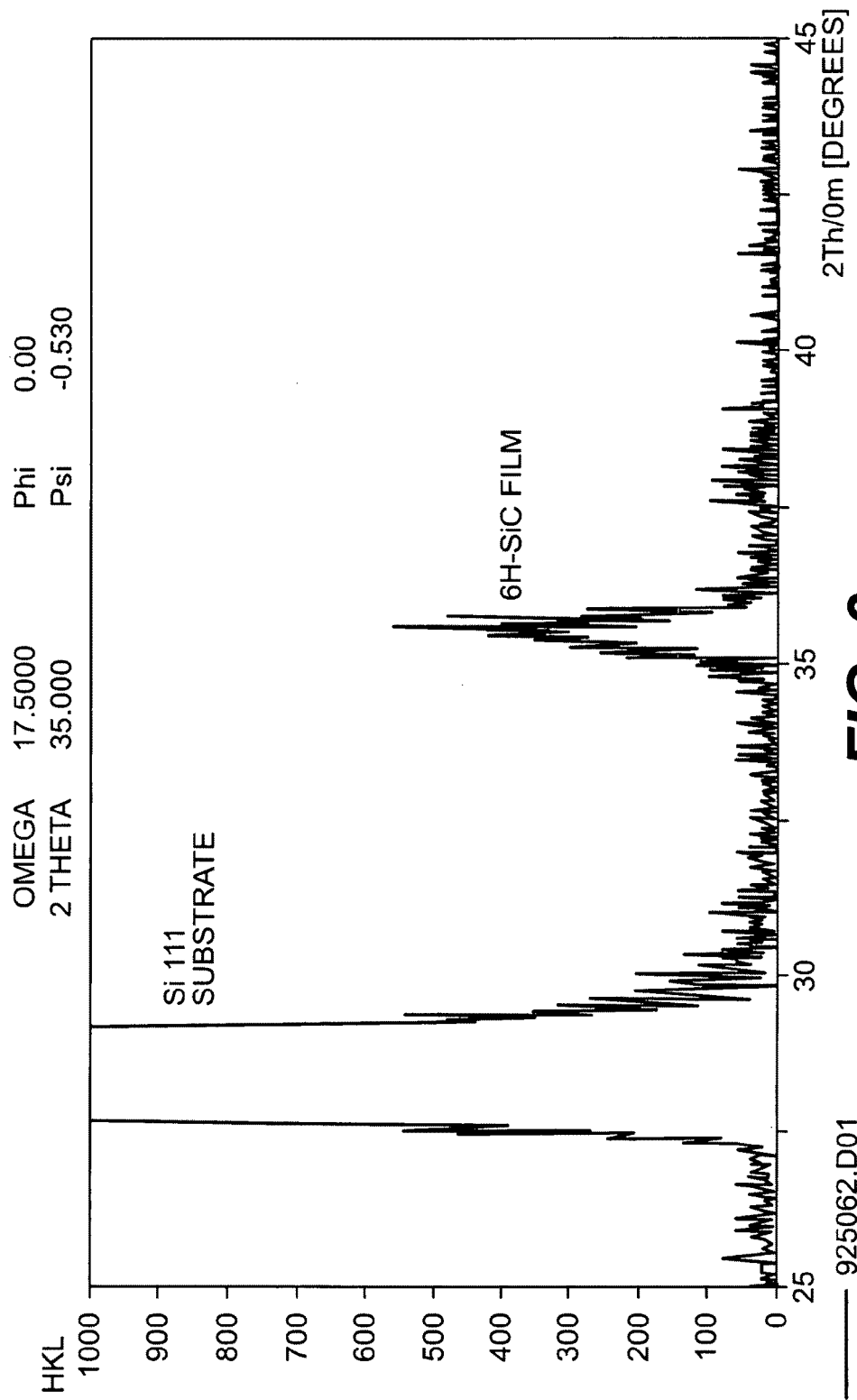
FIG. 3 is an x-ray diffraction survey scan of a SiC-on-Si film.
Figure 4:
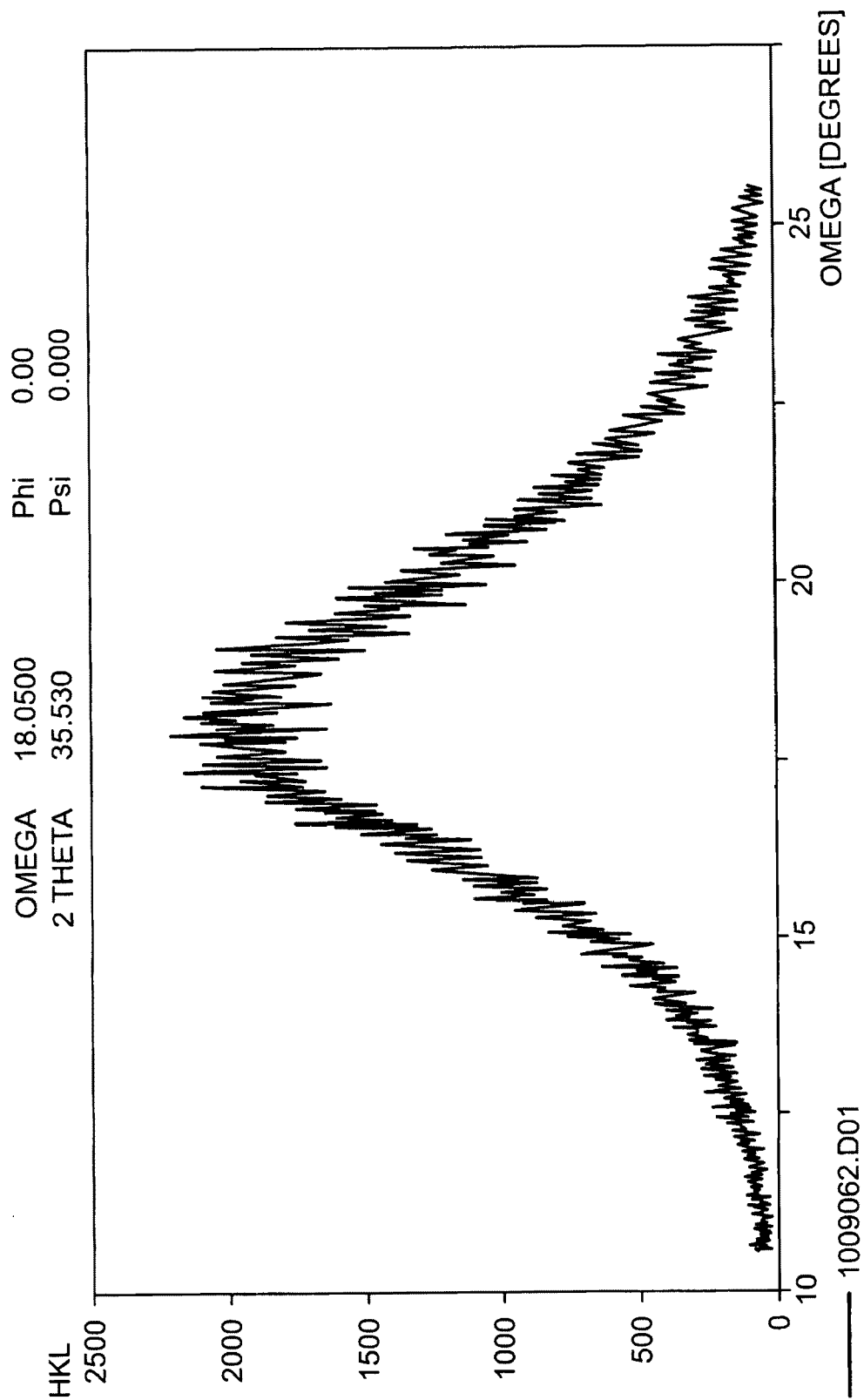
FIG. 4 is an x-ray rocking curve of a SiC-on-Si film.
Figure 5:
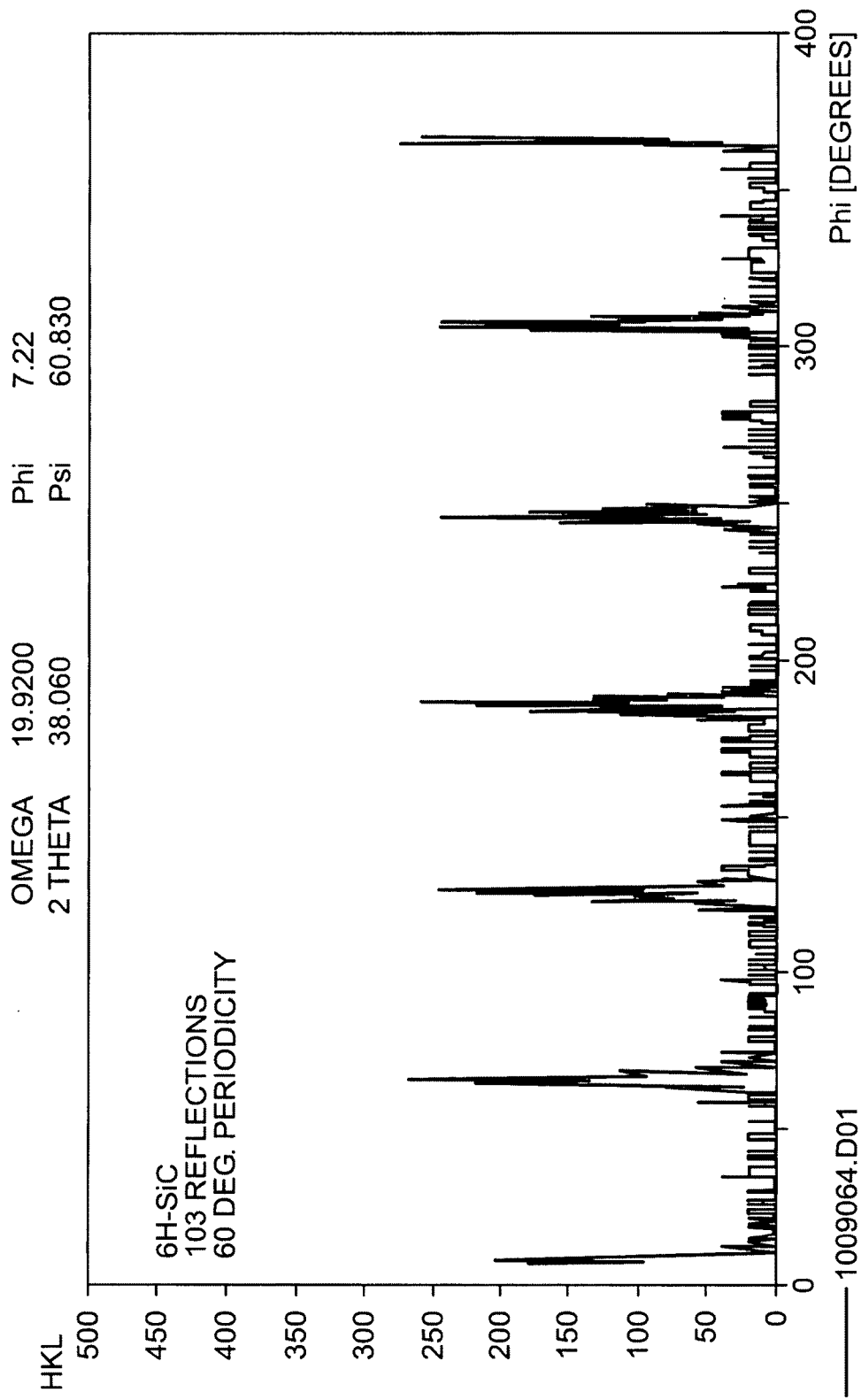
FIG. 5 is a rotation scan of a SiC-on-Si film showing hexagonal crystalline symmetry.
Figure 6:
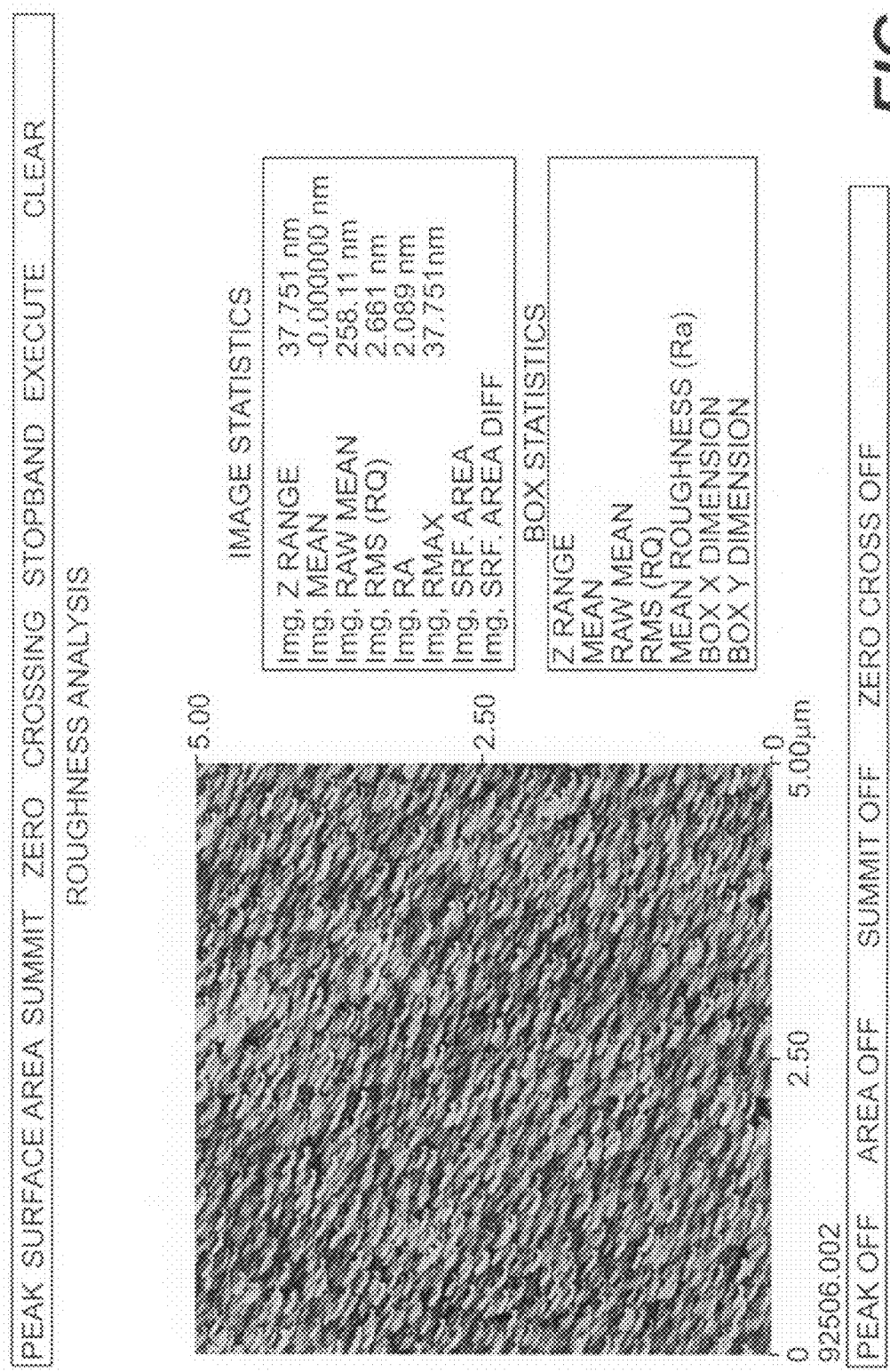
FIG. 6 is an AFM scan showing the grains of a SiC-on-Si film.
Figure 7:
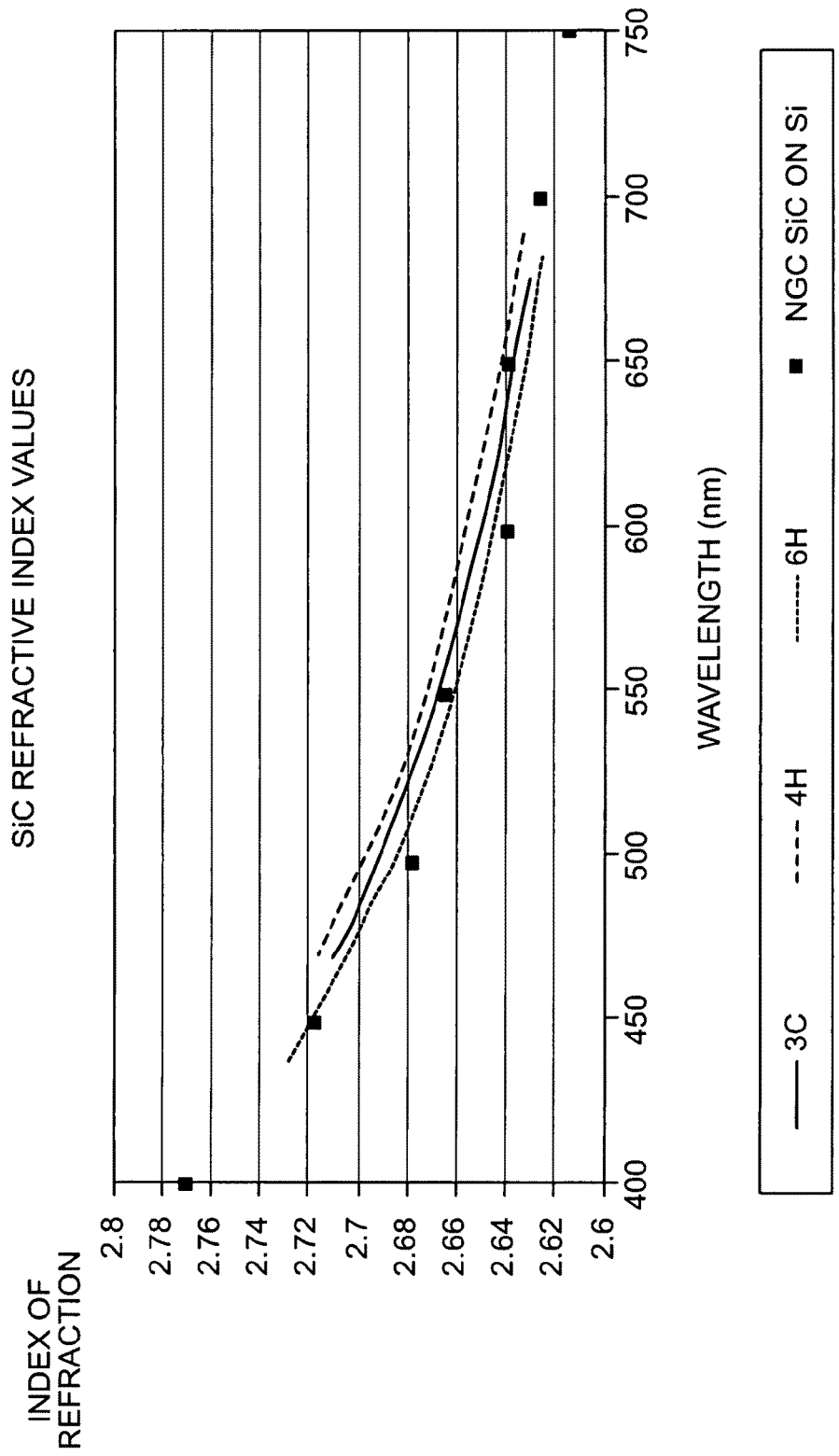
FIG. 7 is diagram comparing the measured refractive indexes of a SiC-on-Si film to known index value of SiC.

The RF sputtered SiC on the Si substrate achieved growth rates of up to 37 A/min, and a crack-free SiC-on-Si film was grown to a thickness of 1.31 μm. The deposition of hexagonal SiC was confirmed by an x-ray diffraction survey scan, which showed both the Si (111) substrate peak and the hexagonal 6H—SiC peak (FIG. 3). The rocking curve of the SiC-on-Si film showed a full width half maximum (FWHM) of 3.3 degrees (FIG. 4), and the rotational scan (FIG. 5) showed a 60 degree periodicity of the 103 reflection in the SiC-on-Si film, further verifying the hexagonal structure of the SiC-on-Si film. FIG. 6 is an atomic force microscope (AFM) scan showing the grains of the SiC-on-Si film. The grain size was approximately 250 nm. The surface of the Si-on-Si film had a root mean square (RMS) roughness value of 2.66 nm. As shown in FIG. 7, the measured refractive index of the SiC-on-Si film was comparable to that from published SiC data.

Example 2

Diode Devices Using SiC Film Deposited on Si Substrate

Figure 8:
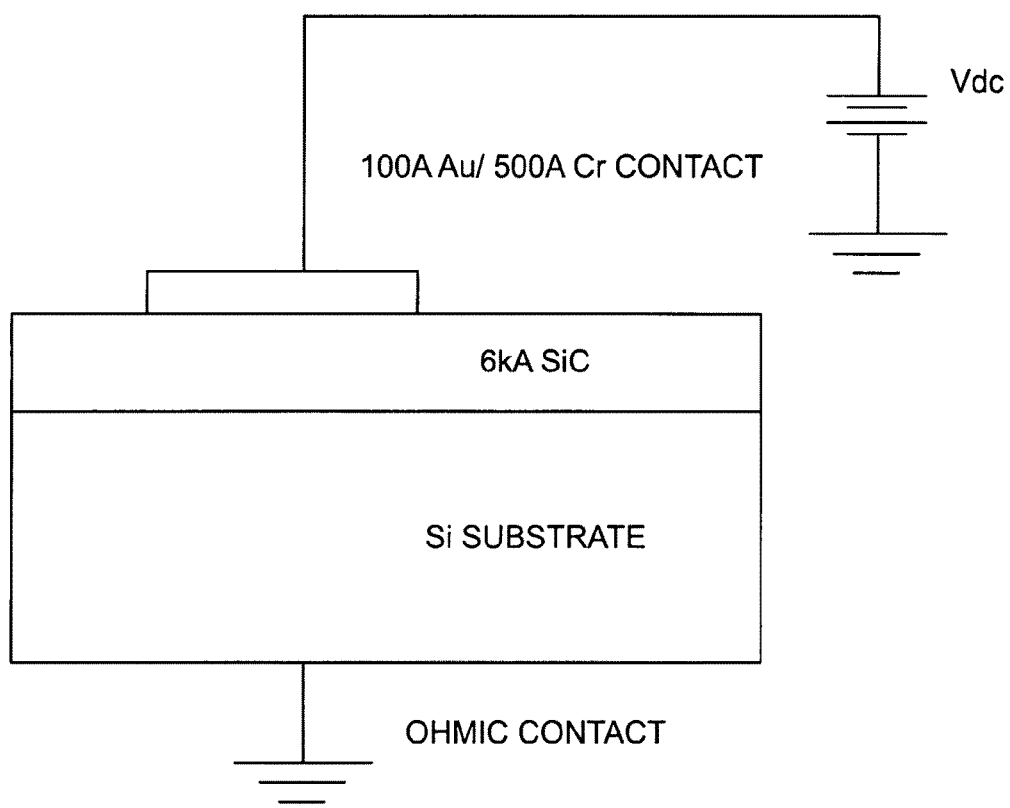
FIG. 8 is a diagram showing the structure of a diode device created on a SiC-on-Si film.

Several diode devices were created by lithographic patterning and evaporation of Cr/Au contacts to the SiC-on-Si film produced in Example 1. The processes used to create the devices (i.e., metal deposition and lithographic lift-off processes) were all standard diode fabrication processes well known to one skilled in the art. A representative structure of such devices is shown in FIG. 8.

Figure 9:
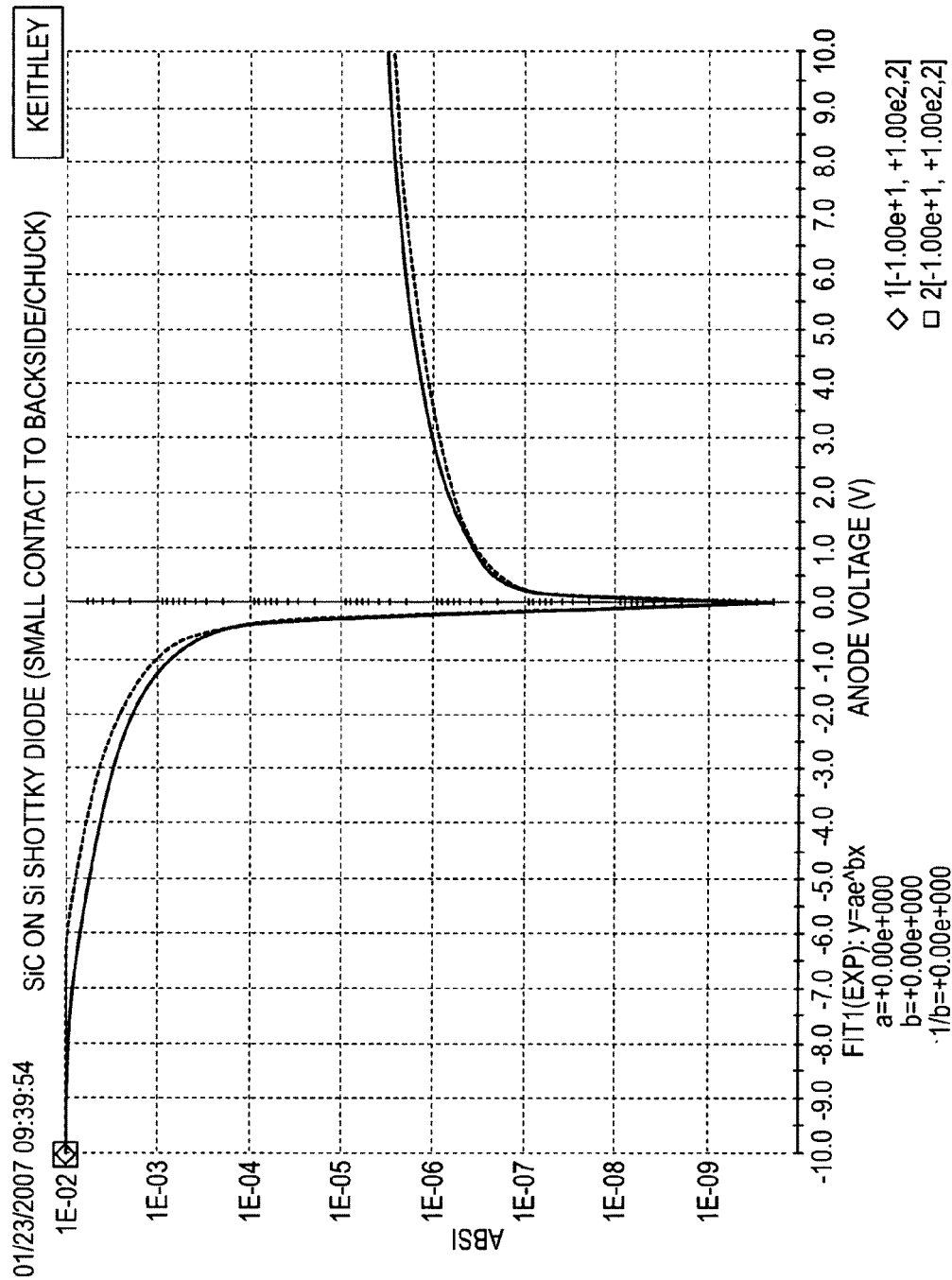
FIG. 9 is a diagram showing an overlay of IV characteristics of three diode devices employing SiC-on-Si films.

Electrical testing on the diode devices was performed using a Keithley 4200 Semiconductor Characterization System (Keithley Instruments, Inc., Cleveland, Ohio). The current-voltage (IV) characteristics of the devices were characterized using the Keithley Interactive Test Environment software (Keithley Instruments, Inc., Cleveland, Ohio). A single diode device was placed under DC bias between the Au/Cr contact on the top surface (anode) and the ohmic contact created between the tester vacuum chuck and the Si substrate. The bias was swept from −10 to +10 volts and the diode device current was measured. FIG. 9 is a plot showing the IV characteristics of three tested devices In this experiment, the "forward bias" operation of the diodes were achieved at negative DC bias, which was simply a function of polarity choice in the test setup. The devices exhibited rectifying behavior characteristics of a diode device, indicating that a working semiconductor device was created with the SiC-on-Si film as an active device material.

Example 3

Deposition of AlN on the SiC-on-Si Film

Figure 10:
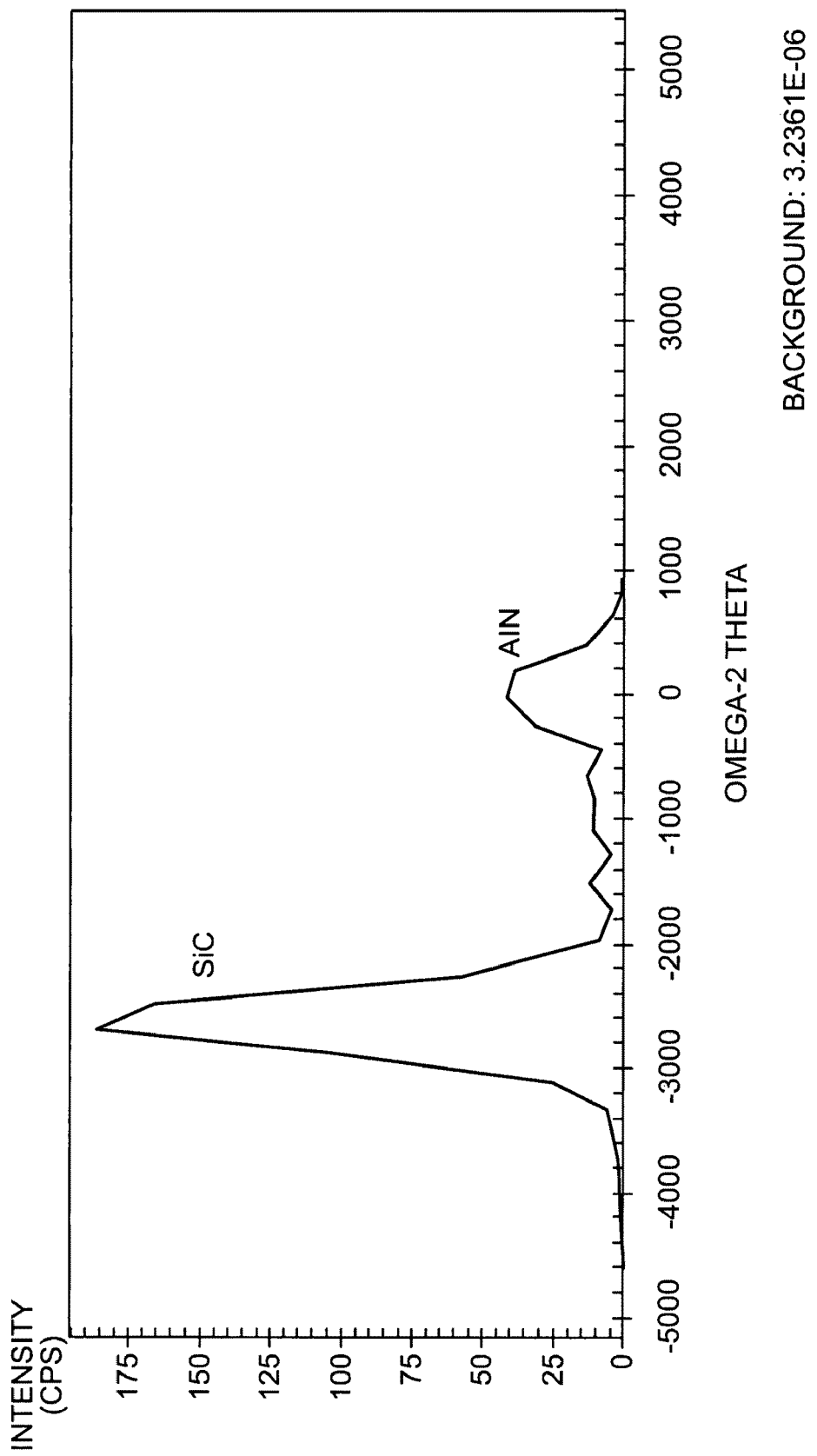
FIG. 10 is an x-ray diffraction survey scan of an AlN-on-SiC-on-Si film.
Figure 11:
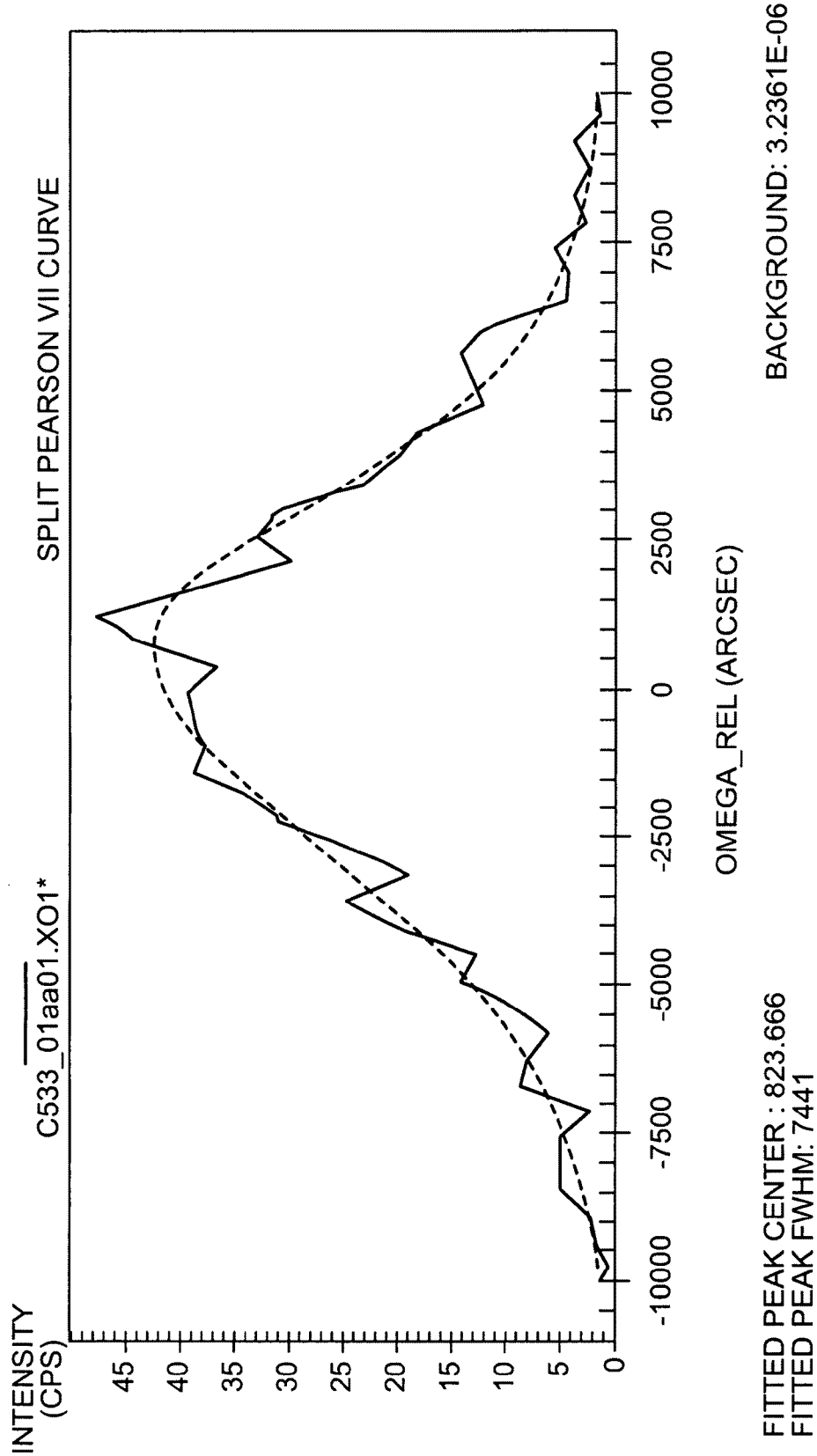
FIG. 11 is an x-ray rocking curve of an AlN-on-SiC-on-Si film.

AlN with a thickness of 1000° A was deposited on the SiC-on-Si film produced in Example 1 using MOCVD to generate an AlN-on-SiC-on-Si film. FIG. 10 is an x-ray diffraction survey scan of the AlN-on-SiC-on-Si film showing both the SiC peak and the AlN peak. FIG. 11 is an x-ray rocking curve of the AlN-on-SiC-on-Si film showing a FWHM of 7441 arcsec or 2.0 degrees.

Example 4

Deposition of GaN on the AlN-on-SiC-on-Si Film

Figure 12:
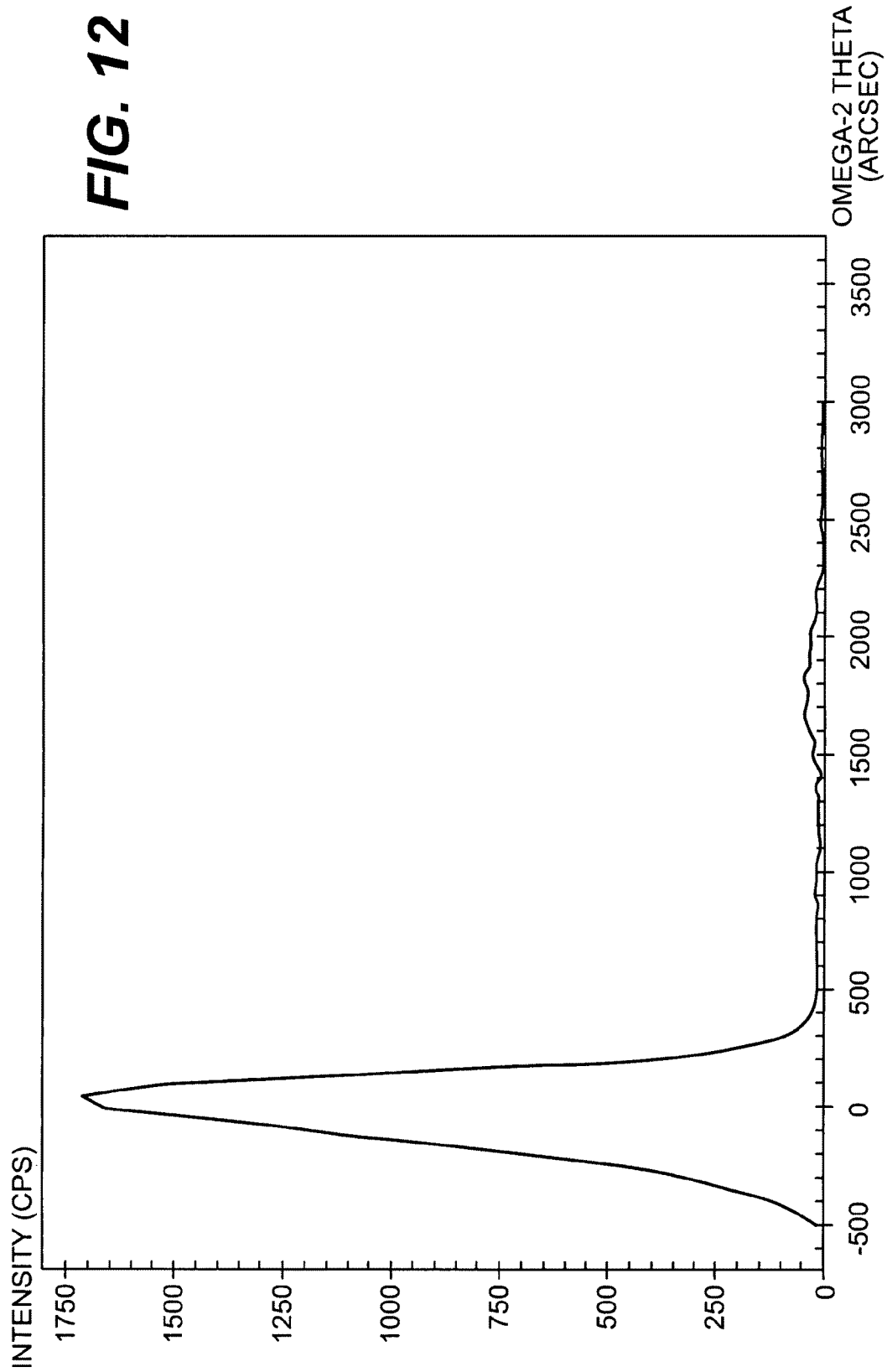
FIG. 12 is an x-ray omega-2 theta curve of a GaN-on-AlN-on-SiC-on-Si film.

GaN was further deposited on the AlN-on-SiC-on-Si film via MOCVD to generate a GaN-on-AlN-on-SiC-on-Si film. FIG. 12 is an x-ray omega-2 theta curve of the GaN-on-AlN-on-SiC-on-Si film showing GaN and AlGaN peaks. The curve shows a single peak of GaN with a FWHM of 2360 arcsec and a negligible AlGaN peak, indicating a GaN film of high quality.

The foregoing discussion discloses and describes many exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for producing an SiC-containing film deposited on an Si substrate, said method comprising:
   etching a Si substrate to remove any native oxide;
   carbonizing said Si substrate after said etching;
   epitaxially growing a first film on said Si substrate at temperatures below 1000° C., wherein said first film is a $SiC_{(x)}AlN_{(1-x)}$ film, where $0<x<1$; and
   epitaxially growing a second film on said $SiC_{(x)}AlN_{(1-x)}$ film, wherein said second film is a GaN film.

2. The method of claim 1, wherein said first film is deposited on said Si substrate using radio-frequency (RF) plasma.

3. The method of claim 2, wherein said RF plasma uses argon as a plasma gas and a growth temperature of about 850° C.

4. The method of claim 1, wherein said first film is deposited on said Si substrate using direct-current (DC) plasma.

5. The method of claim 1, wherein said first film is deposited on said Si substrate using chemical vapor deposition (CVD).

6. The method of claim 5, wherein said CVD is low temperature reactive CVD.

7. The method of claim 1, wherein said first film is deposited on said Si substrate using reactive atomic layer deposition (RALD).

8. The method of claim 7, wherein said RALD is performed in the presence of a low temperature SiC precursor.

9. The method of claim 8, wherein said low temperature SiC precursor is hexanethyldisilane (HMDS).

10. The method of claim 1, wherein said Si substrate is a Si (111) substrate.

11. The method of claim 1, wherein said Si substrate is a semi-insulating Si substrate.

12. The SiC-containing film produced by the method of claim 1.

13. An electronic device comprising the SiC-containing film of claim 12.

14. The electronic device of claim 13, wherein the electronic device is a diode.

* * * * *